United States Patent [19]
Mochida et al.

[11] Patent Number: 6,141,599
[45] Date of Patent: Oct. 31, 2000

[54] METHOD FOR SETTING CONVEYING DATA FOR A LEAD FRAME

[75] Inventors: Toru Mochida, Higashiyamato; Yoshimitsu Terakado, Hachiouji; Masayuki Seguro, Higashimurayama, all of Japan

[73] Assignee: Kabushiki Kaisha Shinkawa, Tokyo, Japan

[21] Appl. No.: 08/892,854

[22] Filed: Jul. 15, 1997

[30] Foreign Application Priority Data

Jul. 16, 1996 [JP] Japan .................................. 8-205295

[51] Int. Cl.⁷ .................................................. G06F 17/00
[52] U.S. Cl. ............................................. 700/114; 29/827
[58] Field of Search .................... 29/827, 833; 382/287; 198/341.05; 700/114

[56] References Cited

U.S. PATENT DOCUMENTS

| | | | |
|---|---|---|---|
| 4,255,851 | 3/1981 | Fotuna | 29/827 |
| 4,543,659 | 9/1985 | Ozaki | 382/8 |
| 4,896,418 | 1/1990 | Yearsley | 29/827 |
| 5,003,692 | 4/1991 | Izumi et al. | 29/834 |
| 5,125,036 | 6/1992 | Raghavan et al. | 382/8 |
| 5,163,222 | 11/1992 | Imlig et al. | 29/827 |
| 5,768,759 | 6/1998 | Hudson | 29/407.04 |
| 5,787,577 | 8/1998 | Kent | 29/833 |
| 5,894,659 | 4/1999 | Kwok et al. | 29/827 |
| 5,896,652 | 4/1999 | Tagata et al. | 29/833 |

FOREIGN PATENT DOCUMENTS

| | | |
|---|---|---|
| 63-56122 | 11/1988 | Japan . |
| 1-32127 | 6/1989 | Japan . |
| 2-4486 | 1/1990 | Japan . |
| 4-346446 | 12/1992 | Japan . |
| 275502 | 10/1993 | Japan . |

*Primary Examiner*—Lee Young
*Assistant Examiner*—Kevin G. Vereene
*Attorney, Agent, or Firm*—Koda & Androlia

[57] ABSTRACT

A method for setting data for conveying a lead frame having a plurality of islands thereon to and from a bonding position of a bonding apparatus including feeding a lead frame so that the first island on the lead frame is positioned at the bonding position and the cross-hairs of a television monitor are aligned with an arbitrary position on the first island, storing the amount of feeding of the lead frame in a data memory, feeding the lead frame next so that the last island on the lead frame is positioned at the bonding position, aligning an arbitrary position on the last island which corresponds to the arbitrary position on the first island with the cross-hairs of the television camera and storing the amount of feeding of the lead frame in the data memory.

4 Claims, 8 Drawing Sheets

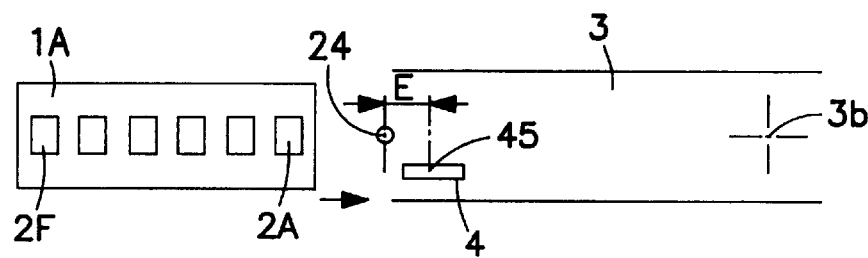
FIG. I(a)
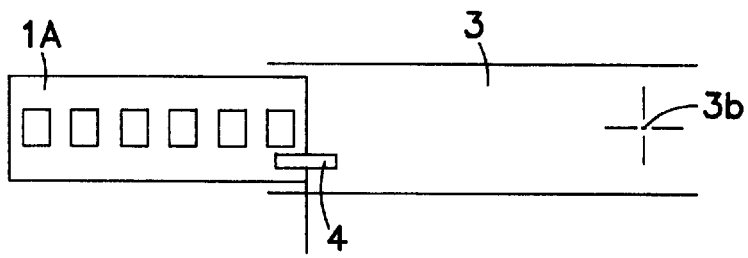
FIG. I(b)
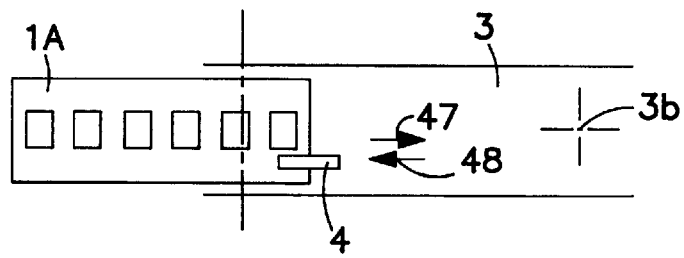
FIG. I(c)
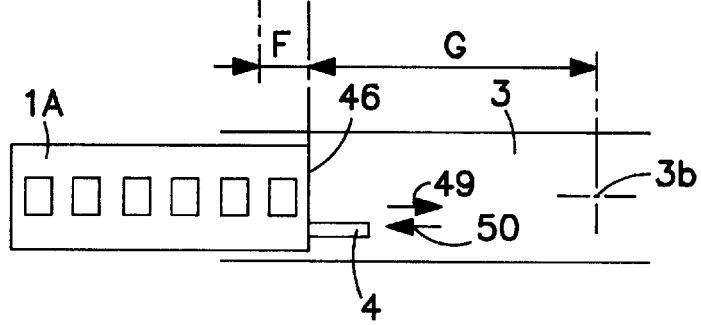
FIG. I(d)
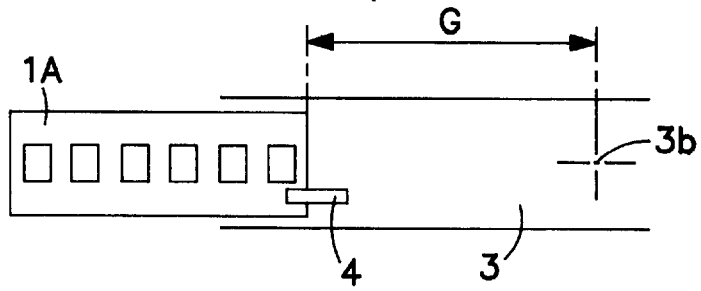
FIG. I(e)
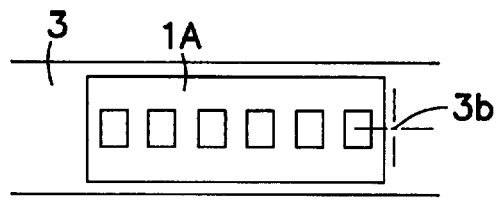
FIG. I(f)

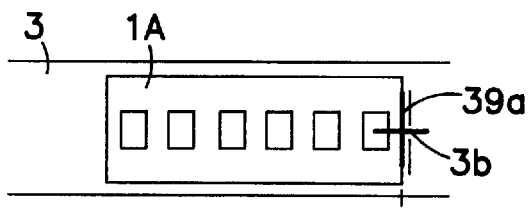
FIG. 5(a)
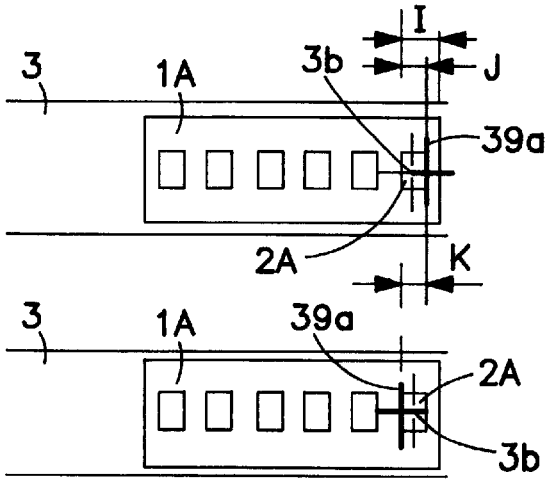
FIG. 5(b)
FIG. 5(c)
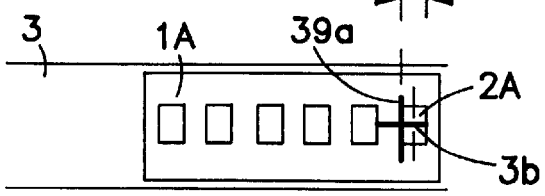
FIG. 5(d)
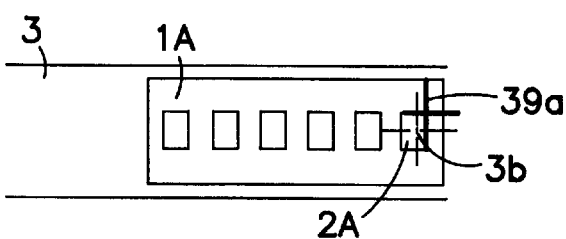
FIG. 5(e)
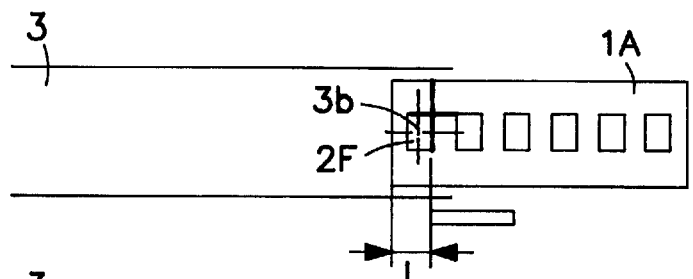
FIG. 5(f)
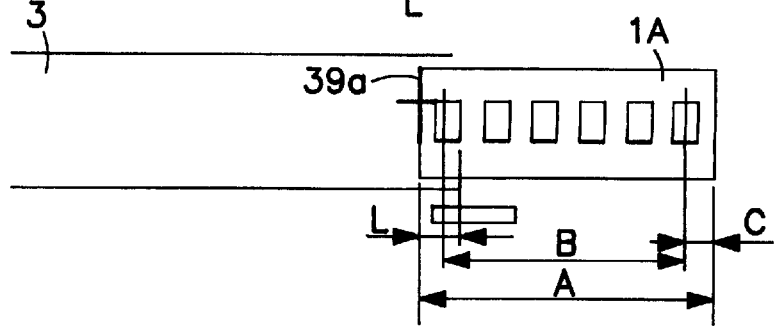

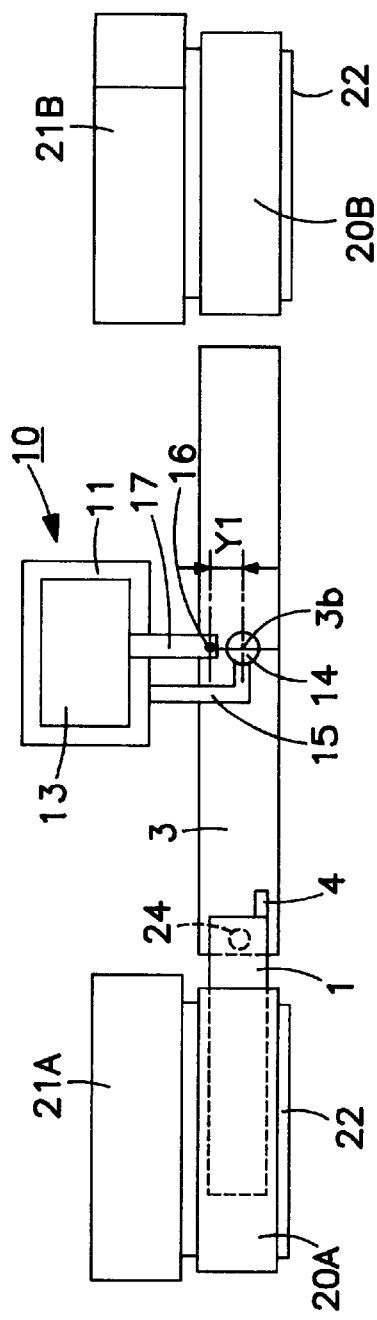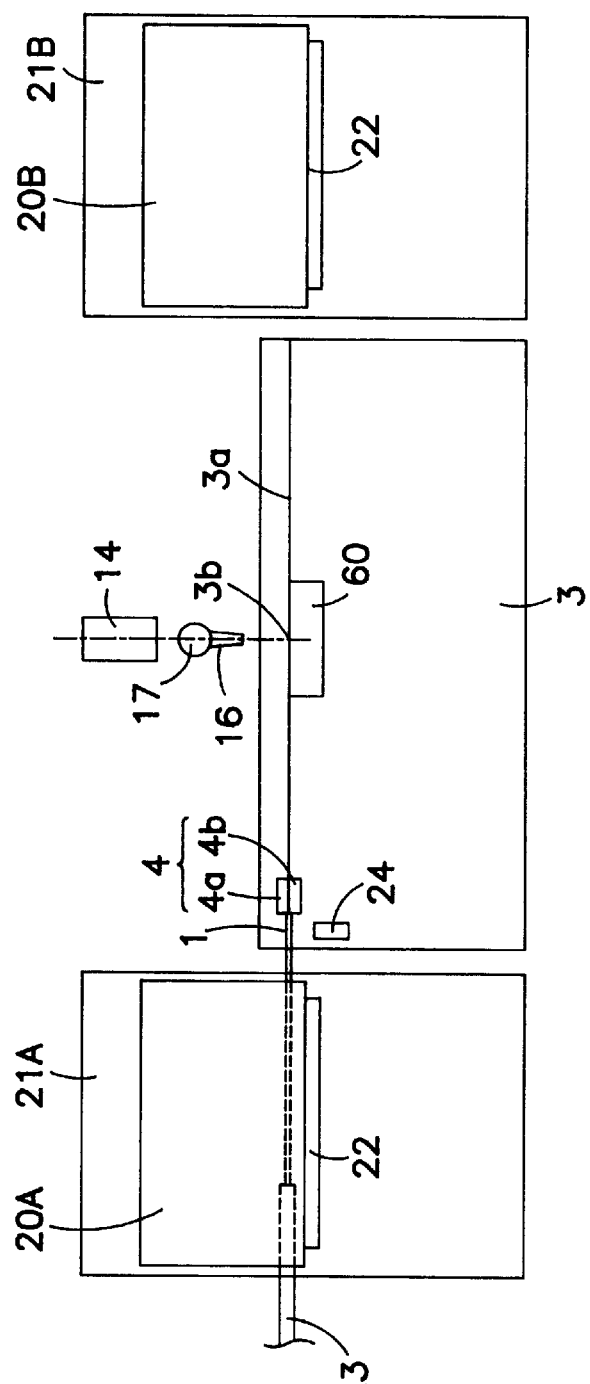
FIG. 10(a)
FIG. 10(b)

METHOD FOR SETTING CONVEYING DATA FOR A LEAD FRAME

BACKGROUND OF THE INVENTION

1. Field of the Invention

The present invention relates to a data setting method in a bonding apparatus and more particularly to a method for setting data which is used to operate a frame feeder for conveying lead frames supplied from a loader side magazine to a bonding position on the bonding stage and then further to an unloader side magazine after the completion of bonding on the lead frames.

2. Prior Art

Examples of conventional methods for conveying lead frames in a bonding apparatus such as a wire bonding apparatus, die bonding apparatus, etc. include the methods described in Japanese Patent Application Publication (Kokoku) No. S63-56122 and Japanese Patent Application Laid-Open (Kokai) No. H4-346446. In such methods, lead frames accommodated inside a loader side magazine are fed out onto the conveying path of a frame feeder by a frame pusher, and a leading end alignment (for aligning a leading end of each lead frame) of the lead frames is performed by a pair of loader side feeding claws, that comprise upper and lower claws, or by positioning pins installed on the claw holder which holds the feeding claws.

Next, each lead frame is intermittently fed by a distance that is equal to a distance between two devices (islands) provided on the lead frame. In other words, the lead frame is intermittently fed by a combination of the opening and closing action and reciprocating motion of the feeding claws so that each one of the devices (or islands) is positioned beneath a television camera installed above the bonding position. Then, the bonding pattern of the lead frame is detected by the television camera; and after a correction of any positional deviation, bonding is performed by the bonding apparatus.

When bonding is completed, the lead frame is moved one pitch by the feeding claws, so that the next device (island) is fed to a point beneath the camera; and after the operation described above, bonding is performed to the device.

When bonding is thus successively performed and completed, the lead frame is fed to the unloader side by the unloader side feeding claws that perform an action similar to that of the loader side feeding claws, so that the lead frame on which bonding has been completed is accommodated in the unloader side magazine.

Thus, in order to feed the device on the lead frame to the bonding position of the bonding stage (i. e., to a position beneath the camera), it is necessary to input lead frame conveying data into a control device beforehand. More specifically, whenever the type of lead frame to be handled changes, conveying data that meets such a lead frame needs to be inputted in the control devices.

The above-identified Japanese Patent Application Publication No. 63-56122 and Japanese Patent Application Laid-Open No. 4-346446 are silent about the method for setting the lead frame conveying data; however, such data is customarily set by the method described below. Though there are various types of lead frames to be handled, the following description will be made in regards to the lead frames 1A and 1B shown in FIGS. 8 and 9.

FIG. 8 shows a lead frame 1A having islands with a constant pitch in between, that is, the islands 2A, 2B . . . 2F have a constant pitch distance d. FIG. 9 shows a lead frame 1B having islands with an irregular pitch in between, that is, the islands 2A, 2B . . . 2F have irregular pitch d1, d2 . . . d5 instead of a constant pitch distance d as in the lead frame of FIG. 8.

In FIGS. 8 and 9, a indicates the frame length, b indicates the distance from the center of the first island 2A to the center of the last island 2F, and c indicates the distance from the leading end of the lead frame 1A or 1B to the center of the first island 2A (such distance being hereafter referred to as the "first pitch").

If the number of the islands 2A, 2B . . . 2F, indicated by n, and the distance b are set, then the constant pitch distance d can be calculated using Equation 1:

$$d = b/(n-1) \qquad \text{Equation 1}$$

The lead frames 1A and 1B are obtained by cutting a hoop material (continuous band-form material) into card shapes. Accordingly, in cases where there is no variation in the cutting positions of the hoop material, the first pitch c is roughly ½ of the constant pitch distance d though it is actually smaller than the constant pitch distance d by an amount equal to the cutting waste. Thus, for lead frames having the first pitch c roughly ½ of the constant pitch distance d, it is possible to feed them without colliding with each other during continuous conveyance thereof by calculating the frame length a by an equation of a=b+d. More specifically, in the case of the lead frame 1A shown in FIG. 8, it is only necessary to set the data n and b; and in the case of the lead frame 1B, it is only necessary to set the data n, b, d1, d2 . . . d5. However, there may be lead frame lots in which the lead frames 1A or 1B show a large variation in the cutting position, or cases in which the first pitch c is not roughly equal to (½)·d in the lead frames 1B that has an irregular pitch. In the case of such lead frames 1A or 1B, it is necessary to set the frame length a and the first pitch c in addition to the data n and b or n, b, d1, d2 . . . d5 in order to prevent the lead frames from colliding with each other when the lead frames are continuously conveyed.

Accordingly, when lead frames 1A or 1B having the first pitch c roughly ½ of the constant pitch distance d are to be conveyed, the data n and b or n, b, d1, d2 . . . d5 are investigated by reference plotted relationships or by actual measurement, and then the numerical values of these elements are inputted into the data memory of the control device by selecting the set-mode of the apparatus. On the other hand, when lead frames 1A or 1B having the first pitch c not roughly ½ of the constant pitch distance d are to be conveyed, the frame length a and first pitch c are investigated in addition to the data n and b or n, b, d1, d2 . . . d5 by reference to plotted relationships or by actual measurement, and then the numerical values of these elements are inputted into the data memory of the control device by selecting the set-mode of the apparatus.

By way of these numerical value inputs, the calculation processing section of the control device calculates the constant pitch distance d for each lead frame 1A using Equation 1 described above, and the main control section of the control device outputs control signals so that portions of the lead frame 1A corresponding to the islands 2A, 2B . . . 2F are successively fed to the bonding position on the bonding stage. On the other hand, in the case of lead frames 1B, the main control section outputs control signals in accordance with the set pitches d1, d2 . . . d5 so that the portions of each lead frame 1B corresponding to the islands 2A, 2B . . . 2F are successively fed to the bonding position on the bonding stage.

Thus, theoretically, the portions of each lead frame 1A or 1B corresponding to the islands 2A, 2B . . . 2F can be successively fed to the bonding position on the bonding stage by inputting the numerical value data as seen above. However, the respective constituent elements of individual frame feeders involve certain amounts of mechanical working error and assembly error. Accordingly, the lead frames 1A or 1B are not accurately fed to the bonding position on the bonding stage merely by setting data according to plotted relationships or actual measurements.

Accordingly, after the data have been set, a check is practically made in order to ascertain whether the lead frame 1A or 1B has actually been accurately conveyed to the bonding position on the bonding stage; and this checking is accomplished by imaging the lead frame with a television camera, viewing the resulting image on a monitor screen, visually checking for any deviation in the feeding pitch, inputting any such deviation as a numerical value, and performing a fine adjustment. In other words, correction values for the deviation in the feeding pitch (feeding pitch correction values) are set when the lead frame 1A or 1B which has been fed to the bonding position on the bonding stage is fed from the first island 2A to the second island 2B, and then to the third island 2C, and so on. This correction of the deviation is repeated until the lead frame 1A or 1B is actually conveyed in an accurate manner.

In the prior art described above, whenever the type of lead frame to be handled is changed to lead frame 1A, it is necessary to set the data n, a, b and c with reference to plotted relationships or by actual measurement, and then to actually feed the lead frame 1A and correct for any deviation; similarly, whenever the type of lead frame to be handled is changed to lead frame 1B, it is necessary to set the data n, a, b, c, d1, d2 . . . d5 in the same manner as in the case of lead frame 1A, and then to actually feed the lead frame 1B and correct for any deviation. As a result, the setting of data requires a considerable amount of time. Furthermore, since the amount of deviation is determined by visual inspection using a monitor screen when fine adjustments are made for the amount of deviation, the amount of deviation cannot be accurately determined, and such fine adjustments must therefore be performed a number of times.

SUMMARY OF THE INVENTION

Accordingly, the first object of the present invention is to provide a method for setting lead frame conveying data which makes it possible to set data that involves positional deviation errors in the feeding pitch derived from mechanical working error or assembly error in each individual frame feeder.

The second object of the present invention is to provide a method for setting lead frame conveying data which can quickly and easily meet changes in the type of lead frame to be handled.

The first means of the present invention for accomplishing the objects is characterized in that in a method for setting lead frame conveying data, a lead frame is fed by a conveying means so that a data point on the lead frame which is required for data setting is positioned at a bonding position, the data point on the lead frame is imaged by a television camera which is installed above the bonding position so that the data point on the lead frame is processed by a position detection means, and then the amount in which the lead frame has been fed is stored in a data memory.

The second means of the present invention for accomplishing the objects is characterized in that in a method for setting lead frame conveying data, a lead frame is fed by a conveying means so that a data point on the lead frame which is required for data setting is positioned at a bonding position, the data point on the lead frame is imaged by a television camera which is installed above the bonding position so that the data point on the lead frame is processed by a position detection means, and then the amount in which the lead frame has been fed and a data processed by the position detection means are stored in a data memory.

The third means of the present invention for accomplishing the objects is characterized in that in the first and second means described above, the processing performed by the position detection means is to align the image of the data point on the lead frame on a television monitor imaged by the television camera with reference marks of the television monitor.

The fourth means of the present invention for accomplishing the objects is characterized in that in the first and second means, the processing performed by the position detection means is to process the image of the data point on the lead frame imaged by the television camera by an image processing means.

The fifth means of the present invention for accomplishing the objects is characterized in that in a method for setting conveying data for lead frames that has islands lined up at a constant pitch, the method comprises: a first process in which the lead frame is fed so that the first island of the lead frame is positioned at a bonding position, an arbitrary position is imaged by a television camera installed above the bonding position and displayed on the television monitor and then reference marks of a television monitor are aligned with an arbitrary position (data point) of the first island, and the amount in which the lead frame has been fed in this case is stored in a data memory; and a second process in which the lead frame is fed so that the last island thereof is positioned at the bonding position, an arbitrary position (data point) of the last island that corresponds to the arbitrary position of the first island is aligned with the reference marks of the television monitor, and the amount in which the lead frame has been fed in this case is stored in the data memory.

The sixth means of the present invention for accomplishing the objects is characterized in that in a method for setting conveying data for lead frames, the method comprises: a first process in which the lead frame is fed so that the first island of the lead frame is positioned at the bonding position, an arbitrary position is imaged by a television camera installed above the bonding position and displayed on the television monitor and then reference marks of a television monitor are aligned with an arbitrary position (data point) of the first island, and the amount in which the lead frame has been fed in this case is stored in a data memory; and a second process in which the lead frame is fed so that each one of the islands of the lead frame following the first island is positioned at the bonding position, an arbitrary position (data point) of each one of the islands that corresponds to the arbitrary position of the first island is aligned with the reference marks of the television monitor, and the amount in which the lead frame has been fed for each one of the islands in this case is stored in the data memory.

[0018]

The seventh means of the present invention for accomplishing the objects is characterized in that in a method for setting conveying data for lead frames that have islands lined up at a constant pitch, the method comprises:

a first process in which the leading end of a lead frame is fed to the vicinity of a bonding position, and the leading end of the lead frame is imaged by a television camera installed above the bonding position and displayed on the television monitor and then the reference marks of a television monitor are aligned with the leading end of the lead frame;

a second process in which the lead frame is fed so that the first island thereof is positioned at the bonding position, and the amount in which the lead frame has been fed in this case is stored in a data memory;

a third process in which the reference marks of the television monitor are aligned with the position of the one end (right end) of the first island, and the amount of movement of the reference marks or the amount of movement of the television camera in this case is stored in the data memory;

a fourth process in which the reference marks of the television monitor are aligned with the position of the another end (left end) of the first island, and the amount of movement of the reference marks or the amount of movement of the television camera in this case is stored in the data memory;

a fifth process in which the reference marks of the television monitor are aligned with an arbitrary position (data point) of the first island;

a sixth process in which the lead frame is fed so that the last island is positioned at the bonding position, an arbitrary position (data point) of the last island that corresponds to the arbitrary position of the first island is aligned with the reference marks of the television monitor, and the amount in which the lead frame has been fed in this case is stored in the data memory; and a seventh process in which the lead frame is fed so that the trailing end of the lead frame is aligned with the reference marks of the television monitor, and the amount in which the lead frame has been fed in this case is stored in the data memory.

[0019]

The eighth means of the present invention for accomplishing the objects is characterized in that in a method for setting conveying data for lead frames, the method comprises:

a first process in which the leading end of a lead frame is fed to the vicinity of a bonding position, and the leading end of the lead frame is imaged by a television camera installed above the bonding position and displayed on the television monitor and then the reference marks of a television monitor are aligned with the leading end of the lead frame;

a second process in which the lead frame is fed so that the first island thereof is positioned at the bonding position, and the amount in which the lead frame has been fed in this case is stored in a data memory;

a third process in which the reference marks of the television monitor are aligned with the position of the one end (right end) of the first island, and the amount of movement of the reference marks or the amount of movement of the television camera in this case is stored in the data memory;

a fourth process in which the reference marks of the television monitor are aligned with the position of the another end (left end) of the first island, and the amount of movement of the reference marks or the amount of movement of the television camera in this case is stored in the data memory;

a fifth process in which the reference marks of the television monitor are aligned with an arbitrary position (data point) of the first island;

a sixth process in which the lead frame is fed so that each one of the islands following the last island is positioned at the bonding position, an arbitrary position (data point) of each one of the islands that corresponds to the arbitrary position of the first island is aligned with the reference marks of the television monitor, and the amount in which the lead frame has been fed for each one of the islands in this case is stored in the data memory; and a seventh process in which the lead frame is fed so that the trailing end of the lead frame is aligned with the reference marks of the television monitor, and the amount in which the lead frame has been fed in this case is stored in the data memory.

BRIEF DESCRIPTION OF THE DRAWINGS

FIGS. 1(a) through 1(f) show a process diagram which illustrates a first embodiment of the method of the present invention for setting lead frame conveying data;

FIGS. 5(a) through 5(f) show a process diagram which illustrates a third embodiment of the method of the present invention for setting lead frame conveying data, the process diagram being a continuation of the process diagram shown in FIGS. 1(a) through 1(f);

FIG. 9 is a plan view of a lead frame which has islands with irregular pitch in between;

FIG. 10 illustrates a lead frame conveying device, in which FIG. 10(a) is a schematic plan view, and FIG. 10(b) is a front view.

DETAILED DESCRIPTION OF THE INVENTION

Figure 11:
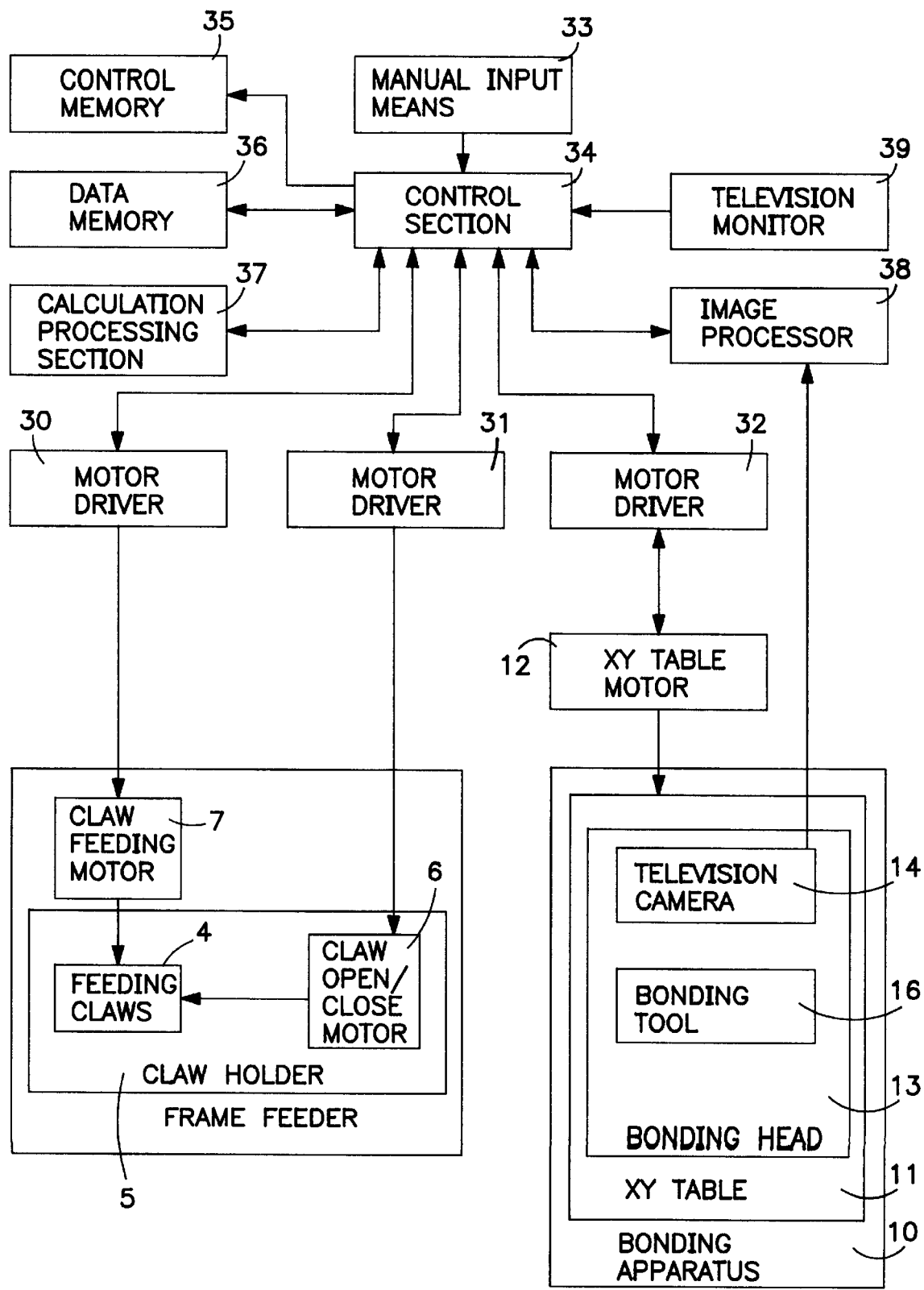
FIG. 11 is a block diagram of the control device used in the method of the present invention for setting lead frame conveying data.

First, before the embodiments of the present invention are described, a description of the structure of the overall bonding apparatus and the structure of a control device used with the bonding apparatus will be presented with reference to FIGS. 10 and 11.

The frame feeder 3 includes feeding claws 4 consisting of an upper claw 4a and a lower claw 4b, and these feeding claws 4 are installed on a claw holder 5 (see FIG. 11) so that the claws 4 are opened and closed by a claw open/close motor 6. A claw holder 5 is caused to move along frame conveying path 3a of the frame feeder 3 by a claw feeding motor 7. The frame feeder 3 of this type is disclosed in, for example, Japanese Patent Application Publication (Kokoku) No. S63-56122 and Japanese Patent Application Laid-Open (Kokai) No. H4-346446, which are listed above in the Prior Art section of this specification.

A bonding apparatus 10 such as a wire bonding apparatus, die bonding apparatus, etc. is installed on one side of the frame conveying path 3a so as to face the bonding position 3b. The bonding apparatus 10 includes an XY table 11, and this XY table 11 is driven in the X-Y (horizontal) directions by an XY table motor 12. A bonding head 13 is mounted on the XY table 11, and a camera holder 15 is fastened to this bonding head 13; in addition, a television camera 14 is mounted on the camera holder 15. Furthermore, a bonding arm 17 to which a bonding tool 16 is attached is installed on the bonding head 13 so that the bonding arm 17 can move up and down in FIG. 10(b). The television camera 14 is positioned above the bonding position 3b, and the bonding tool 16 is offset by a distance of Y1 with respect to the television camera 14 as best seen in FIG. 10(a). The bonding arm 17 is raised and lowered by a Z (raising-and-lowering) motor (not shown).

This type of bonding apparatus is disclosed in, for example, Japanese Patent Application Laid-Open (Kokai) No. H5-275502.

Figure 8:
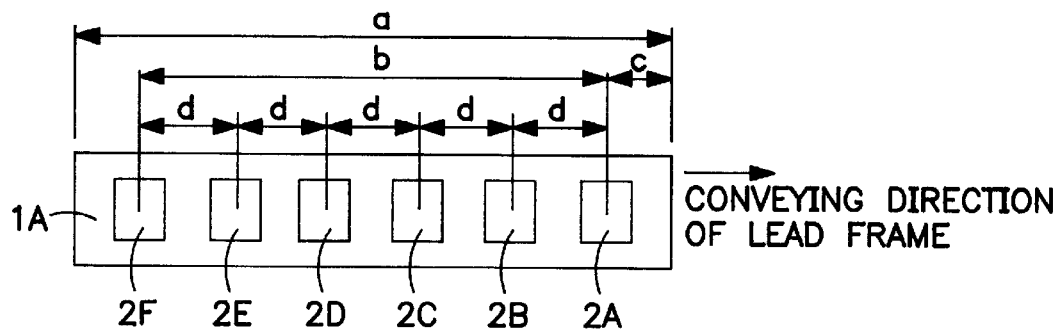
FIG. 8 is a plan view of a lead frame which has islands arranged at a constant pitch.

A loader side magazine 20A and an unloader side magazine 20B are provided at the respective ends of the frame conveying path 3a of the frame feeder 3. The loader side magazine 20A and unloader side magazine 20B are positioned and carried on magazine holders 22 which are respectively driven upward and downward by a loader side elevator device 21A and an unloader side elevator device 21B. Lead frames 1 (1A shown in FIG. 8 or 1B shown in FIG. 9) inside the loader side magazine 20A are pushed out onto the frame conveying path 3a by a frame pusher 23.

These type of elevator devices 21A and 21B are disclosed in, for instance, Japanese Patent Application Publication (Kokoku) Nos. H1-32127 and H2-4486 and in Japanese Patent Application Laid-Open (Kokai) No. S63-56122.

In FIG. 10, the reference numeral 24 is a photo sensor which detects lead frames 1 pushed out by the frame pusher 23.

FIG. 11 shows the control device for the bonding apparatus of FIG. 10.

As shown in FIG. 11, the claw open/close motor 6 and the claw feeding motor 7 of the frame feeder 3, and the XY table motor 12 of the bonding apparatus 10 are respectively controlled by motor drivers 30, 31 and 32; and these motor drivers 30, 31 and 32 can be directly driven by a manual input means 33 through a main control section 34. Alternatively, it is possible to drive the motor drivers 30, 31 and 32 by way of the main control section 34 in accordance with a program stored in a control memory 35. Furthermore, various types of data are inputted into a data memory 36 via the main control section 34 using the manual input means 33. The data stored in the data memory 36 are processed by a calculation processing section 37 as respective data for controlling the motor drivers 30, 31 and 32; and such processed data are also stored in the data memory 36. The images picked up or imaged by the television camera 14 are subjected to image processing by an image processor 38, and the resulting processed images are displayed on a television monitor 39. Various types of data and setting modes stored in the data memory 36 are selected and displayed on the television monitor 39 by way of the manual input means 33.

Figure 2A:
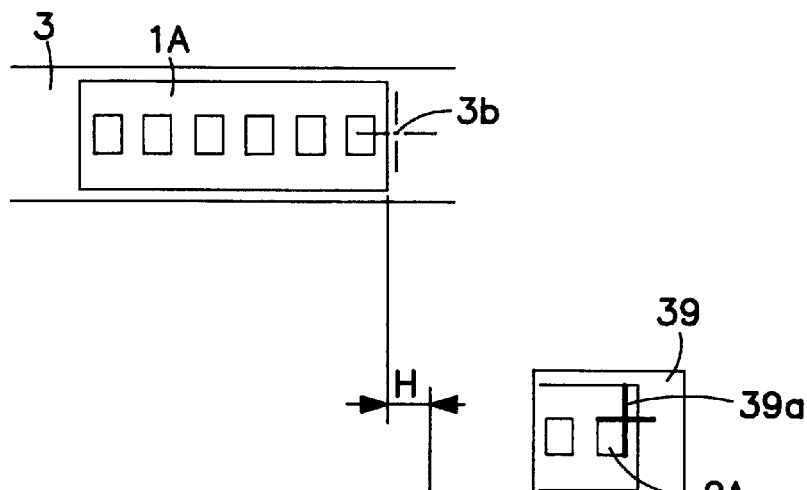
FIGS. 2(a) through 2(d) show a process diagram which follows the process diagram of FIGS. 1(a) through 1(f)

Next, a first embodiment of the present invention will be described with reference to FIGS. 1 through 3 and further to FIGS. 8, 10 and 11. The lead frames used in this embodiment is the one shown in FIG. 8; and therefore, the lead frame 1A has islands 2A, 2B . . . 2F installed at a constant pitch distance d, and the first pitch c is approximately (½)·d.

First, frame mode displayed on the television monitor 39 is selected using the manual input means 33 shown in FIG. 11. As a result, data input conditions stored in the control memory 35 are displayed on the television monitor 39 via the main control section 34. Then, the number n representing the number of the islands 2A, 2B . . . 2F on the lead frame 1A is inputted using the manual input means 33. The lead frame shown in FIG. 8 has six islands; therefore, n is 6, and "6" is inputted via the manual input means 33. Data of this number n is stored in the data memory 36 through the main control section 34. In cases where the number of islands n does not change when the type of lead frame to be handled changes, there is of course no need to input the number n of the islands.

Next, using the manual input means 33, frame teaching is selected in the program mode displayed on the television monitor 39. Meanwhile, the process shown in FIGS. 1(a) through 1(f) is pre-programmed in the control memory 35. In other words, this pre-programmed process is to chuck, by the feeding claws 4, a lead frame 1A which is pushed out of the loader side magazine 20A by the frame pusher 23 and then to bring, by the feeding claws 4, the leading end of the lead frame 1A to the vicinity of the bonding position 3b. In this case, the distance E from the photo sensor 24 shown in FIG. 1(a) to the frame holder 45 of the feeding claws 4, the distance F from the position of the lead frame 1A shown in FIG. 1(b) to an alignment position 46 (i. e., the leading end aligning position) shown in FIG. 1(d), and the distance G from the alignment position 46 to the bonding position 3b, are stored in the data memory 36 beforehand.

Accordingly, when the fame teaching mode is selected, the frame pusher 23 pushes out a lead frame 1A at a low speed from the state shown in FIG. 1(a) until this lead frame 1A is detected by the photo sensor 24. In this case, the feeding claws 4 are in an open state. When the photo sensor 24 detects the lead frame 1A, the low-speed pushing action of the frame pusher 23 is terminated; and the frame pusher 23 pushes out the lead frame 1A by the distance E as shown in FIG. 1(b). As a result, the feeding claws 4 are put in a state which allows the feeding claws 4 to chuck the lead frame 1A. Then, the feeding claws 4 are closed and chuck the lead frame 1A; and as shown in FIG. 1(c), the feeding claws 4 are moved to a point which is slightly beyond the alignment position 46 stored in the data memory; in other words, the feeding claws 4 are moved a distance which is slightly greater than the distance F.

Then, an alignment operation is performed.

More specifically, the feeding claws 4 are opened so as to release the lead frame 1A, and the feeding claws 4 are moved slightly in the direction of arrow 47. Then, if the frame feeder described in the Japanese Patent Application Publication (Kokoku) No. S63-56122 is used, the feeding claws 4 are closed and moved in the direction of arrow 48, so that the leading end of the lead frame 1A is pushed back by the feeding claws 4, thus causing the leading end of the lead frame 1A to be positioned in the alignment position 46 as shown in FIG. 1(d). Then, after again being moved slightly in the direction of arrow 49, the feeding claws 4 are opened and then moved in the direction of arrow 50, so that the feeding claws 4 chuck the lead frame 1A as shown in FIG. 1(e). On the other hand, if the frame feeder described in the Japanese Patent Application Laid-Open (Kokai) No. H4-346446 is used, the feeding claws 4 in an open state are moved in the direction of arrow 48 after a positioning pin (not shown) projects into the frame conveying path 3a, so that the leading end of the lead frame 1A is pushed back by the positioning pin, thus causing the leading end of the lead frame 1A to be positioned at the alignment position 46. Then, the feeding claws 4 are again moved slightly in the direction of arrow 49 and subsequently moved in the direction of arrow 50, so that the feeding claws 4 can chuck the lead frame 1A as shown in FIG. 1(e).

Next, the feeding claws 4 are closed so as to chuck the lead frame 1A and then moved the distance G stored in the data memory 36. As a result, as shown in FIG. 1(f), the leading end of the lead frame 1A is automatically brought to the vicinity of the bonding position 3b. However, even if the lead frame 1A is thus fed the distance G by the feeding claws 4, the feeding system of the feeding claws 4 of the frame feeder contains mechanical error; accordingly, in the state shown in FIG. 1(f), the leading end of the lead frame 1A does not coincide with the bonding position 3b.

Next, the process shown in FIG. 2 is performed. FIG. 2(a) shows the same state as FIG. 1(f).

Figure 2B:
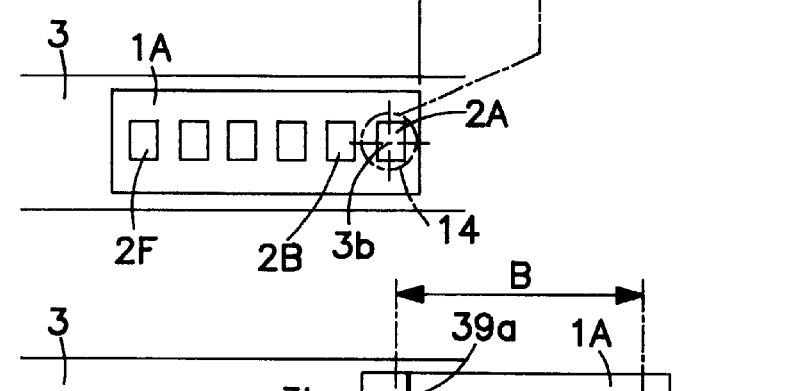
Figure 3:
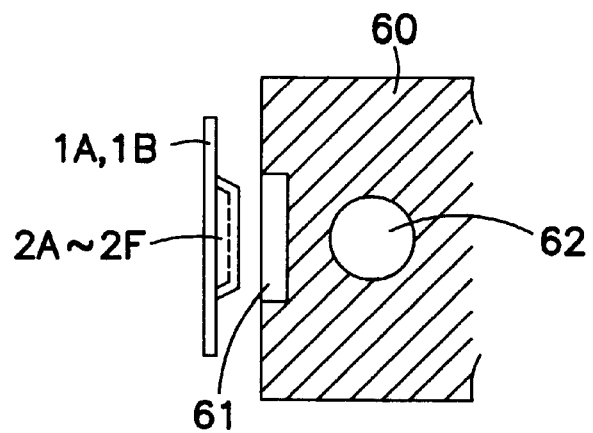
FIG. 3 shows a cross section showing the relationship between the lead frame and the bonding stage.

As shown in FIG. 2(b), the feeding claws 4 are moved using the manual input means 33 so that the first island 2A of the lead frame is aligned with an island groove 61 formed in the bonding stage 60 (see FIG. 3) at the bonding position 3b. In FIG. 3, the reference numeral 62 is a heater. After it has been visually confirmed by a microscope that the first island 2A is aligned with the island groove 61, a universally known electrical chessman which moves cross-hairs 39a formed on the television monitor 39 is operated so that the cross-hairs 39a of the television monitor 39 are aligned with an arbitrary position (data point) on the first island 2A (for instance, one of the corners of the first island 2A) in the image of the first island 2A which is picked up or imaged by the television camera 14 and then displayed on the television monitor 39. Afterward, a switch is pressed, so that data indicating the distance H by which the lead frame 1A has been moved or fed by the feeding claws 4 from the state shown in FIGS. 1(f) and 2(a) to the state shown in FIG. 2(b) is stored in the data memory 36. The position of the cross-hairs 39a acts as a mark for setting the next island.

Figure 2C:
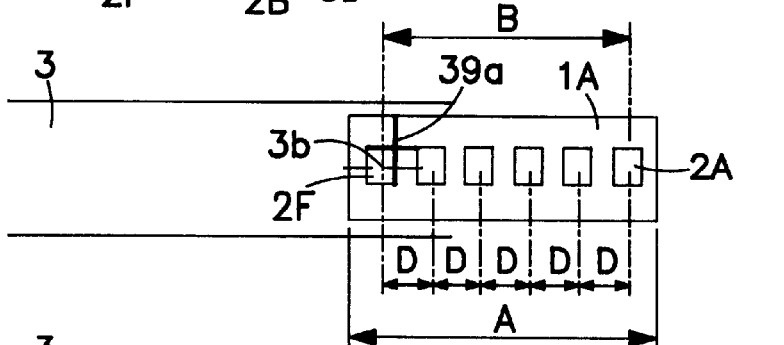
Figure 2D:
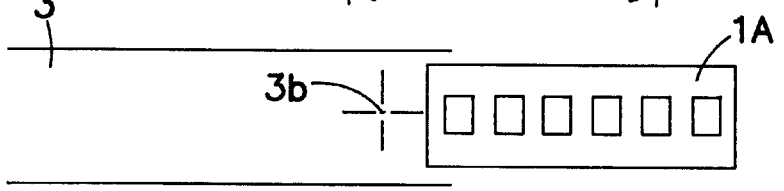

Next, as shown in FIG. 2(c), the feeding claws 4 are moved using the manual input means 33 so that the lead frame 1A is moved or fed until the last island 2F thereon reaches the position of the island groove 61 of the bonding stage 60 at the bonding position 3b. The feeding of the lead frame 1A in this case is either continuous feeding or intermittent feeding done by the reciprocating movement of the feeding claws 4. Next, the feeding claws 4 are moved using the manual input means 33 so that an arbitrary position (data point) on the last island 2F (in this case, one of the corner portions of the last island 2F) is aligned with the cross-hairs 39a of the television monitor 39. Then, after it has been visually confirmed by a microscope that the last island 2F is aligned with the island groove 61 at the bonding position 3b, the switch is pressed. As a result, data indicating the distance B by which the lead frame 1A has been moved or fed by the feeding claws 4 from the state shown in FIG. 2(b) to the state shown in FIG. 2(c) is stored in the data memory 36.

As a result of this operation, the setting of data is completed.

Afterward, as shown in FIG. 1(d), the lead frame 1A is conveyed and accommodated in the unloader side magazine 20B by the unloader side feeding claws (not shown).

Using the number of islands n and the distance B from the first island 2A to the last island 2F in the data, the calculation processing section 37 calculates the constant pitch distance D using Equation 2 below; and the calculation processing section 37 calculates the first pitch C and the frame length A using Equation 3 and Equation 4

$$D = B/(n-1) \qquad \text{Equation 2}$$

$$C = (\tfrac{1}{2}) \cdot D \qquad \text{Equation 3}$$

$$A = B + D \qquad \text{Equation 4}$$

Thus, whenever there is a change in the type of product (lead frame) to be handled, the data required for conveying the changed lead frame 1A can be set by performing:

a first process in which
   a lead frame 1A is fed so that the first island 2A is positioned at the bonding position 3b,
   the cross-hairs 39a of the television monitor 39 are aligned with an arbitrary position (data point) on the first island 2A, and
   the amount in which the lead frame 1A has been moved or fed in this case is stored in the data memory 36, and a second process in which
   the lead frame 1A is fed so that an arbitrary position on the last island 2F of the lead frame that corresponds to the arbitrary position on the first island 2A is aligned with the cross-hairs 39a of the television monitor 39, and
   the amount in which the lead frame 1A has been moved or fed in this case is stored in the data memory 36.

In other words, a data setting is accomplished by moving or feeding the lead frame 1A by the feeding claws 4 of the frame feeder, which actually involves a certain amount of error; accordingly, a data setting which involves this error can be accomplished during the setting operation, so that there is no need to check the conveyance or to perform fine adjustments after the completion of data setting.

Accordingly, when ordinary lead frames that have islands arranged at a constant pitch are to be conveyed: each lead frame 1A that is pushed out of the loader side magazine 20A by the frame pusher 23 is positioned by the process illustrated in FIGS. 1(a) through 1(d), thus performing the leading end alignment operation of the lead frame; the feeding claws 4 are moved by a distance that corresponds to the data (G+H) stored in the data memory 36, thus positioning the first island 2A at the bonding position 3b; a bonding pattern including a device bonded to the first island 2A is detected by the television camera 14; next, the control device corrects the coordinates stored in the bonding coordinate memory in accordance with the positional deviation that is detected; bonding is performed by the bonding apparatus 10; following the completion of bonding, the lead frame 1A is moved by the constant pitch distance D stored in the data memory so that the second island 2B is positioned at the bonding position; bonding is performed to the second island 2B by the same operation as that described above; the above operation is successively repeated until bonding to the last island 2F is completed; and then the lead frame 1A is accommodated inside the unloader side magazine 20B by the unloader side feeding claws (not shown).

FIG. 4 illustrates a second embodiment of the present invention. In this embodiment, a lead frame of the type 11B shown in FIG. 9 which has irregularly pitched islands are used, and this lead frame 1B has the first pitch c which is approximately equal to (½)·d.

More specifically, the number n of islands 2A, 2B . . . 2F on the lead frame 1B is inputted using the manual input means 33; and, by way of the manual input means 33, frame teaching is selected in the frame mode displayed on the television monitor 39. As a result, the leading end of the lead frame 1B is automatically conveyed to the vicinity of the bonding position 3b as shown in FIG. 1(f) because of the process taken as shown in FIGS. 1(a) through 1(f) as in the case of the first embodiment. Of course, if there is no change in the number of islands, then there is no need to input the number of islands n. In this embodiment, since the pitches D1 through D5 of the respective islands are going to be set as described below, the number of islands n can be automatically stored in the data memory 36.

Figure 4A:
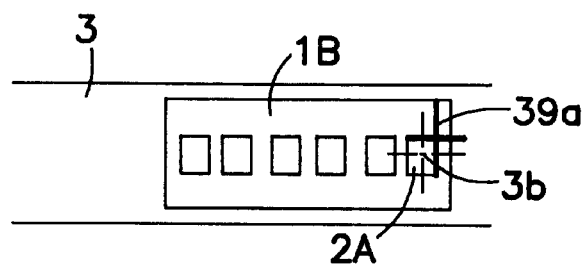
FIGS. 4(a) through 4(c) show a process diagram which illustrates a second embodiment of the method of the present invention for setting lead frame conveying data, the process diagram being a continuation of the process diagram shown in FIGS. 1(a) through 1(f)

Next, the process shown in FIG. 4(a) is performed. This process is the same as the process shown in FIG. 2(b) of the first embodiment. More specifically, as shown in FIG. 4(a), the feeding claws 4 are moved using the manual input means 33 so that the first island 2A is aligned with an island groove 61 of the bonding stage 60 which is at the bonding position 3b. After it has been visually confirmed by means of a microscope that the first island 2A is aligned with the island groove 61, a universally known electrical chessman which moves the cross-hairs 39a of the television monitor 39 is operated so that the cross-hairs 39a of the television monitor 39 are aligned with an arbitrary position (data point) on the first island 2A, e. g., one of the corners of the first island 2A. Afterward, a set button is pressed. As a result, data of the distance H by which the lead frame 1B has been moved or fed by the feeding claws 4 from the state shown in FIG. 1(f) to the state shown in FIG. 4(a) is stored in the data memory 36. The position of this cross-hairs 39a acts as a mark for the setting of the next island.

Figure 4B:
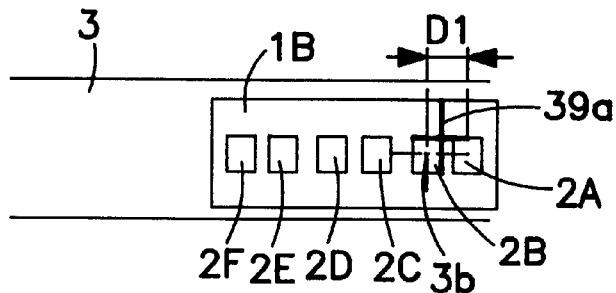

Next, as shown in FIG. 4(b), the feeding claws 4 are moved using the manual input means 33 so that a corner portion of the second island 2B is aligned with the cross-hairs 39a of the television monitor 39 as in the same manner as in the positioning of the first island 2A shown in FIG. 4(a). Next, after it has been visually confirmed by a microscope that the second island 2B is aligned with the island groove 61 of the bonding stage 60 at the bonding position 3b, the set button is pressed. As a result, the distance D1 by which the lead frame 1B has been moved or fed from the position shown in FIG. 4(a) to the position shown in FIG. 4(b) is stored in the data memory 36.

The operation shown in FIG. 4(b) is repeated for the third, fourth, fifth and last islands 2C, 2D, 2E and 2F.

Figure 4C:
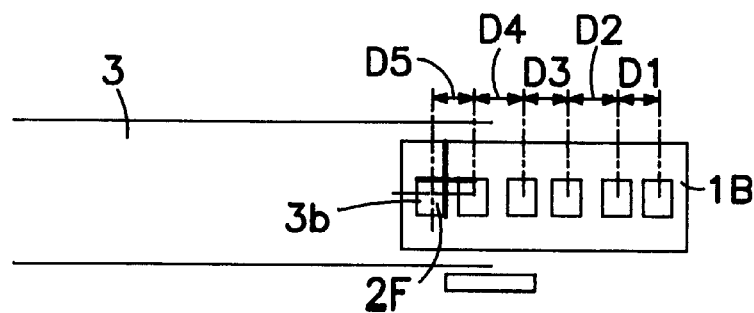

FIG. 4(c) shows the state that the positioning of the last island 2F has been completed. As a result, the pitch distances D2, D3, D4 and D5 are stored in the data memory 36.

As a result of the above operations, the setting of data is completed.

Afterward, the lead frame 1B is accommodated inside the unloader side magazine 20B by the unloader side feeding claws (not shown). In cases where the number of islands n is to be automatically set, the number of times that the set button is pressed, when the respective islands are aligned with the cross-hairs 39a, is stored in the data memory 36 as the number of islands n.

Thus, whenever there is a change in the type of product (lead frame) to be handled, the data required for the conveying of the changed lead frames 1B can be set by:

a first process in which,
a lead frame 1B is fed so that the first island 2A is positioned at the bonding position 3b,
the cross-hairs 39a of the television monitor 39 are aligned with an arbitrary position (data point) on the first island 2A, and
the amount in which the lead frame 1B has been moved or fed in this case is stored in the data memory 36, and a
second process in which
the lead frame 1B is fed so that arbitrary positions (data points) on the respective islands 2B, 2C . . . 2F following the first island 2A (each of the arbitrary positions corresponding to the arbitrary position on the first island 2A) are aligned with the cross-hairs 39a of the television monitor 39, and
the respective amounts in which the lead frame 1B has been moved or fed in each of the cases are stored in the data memory 36.

In other words, a data setting is accomplished by moving or feeding a lead frame 1B by the feeding claws 4 of the frame feeder, which actually involves a certain amount of error; accordingly, a data setting which involves this error can be accomplished during the setting operation, so that there is no need to check the conveyance or to perform fine adjustments after the completion of data setting.

FIG. 5 illustrates the third embodiment of the present invention. In this embodiment, lead frames of the type 1A shown in FIG. 8 are handled as in the first embodiment; however, unlike in the first embodiment, the first pitch c of the lead frame 1A is not roughly ½ of the constant pitch distance d. Accordingly, in this third embodiment, the leading end and trailing end of the lead frame 1A are checked in addition to the processes performed in the first embodiment.

More specifically, when frame teaching is selected in the program mode displayed on the television monitor 39 by the manual input means 33, the leading end of the lead frame 1A is automatically brought to the vicinity of the bonding position 3b as shown in FIG. 1(f) by way of the process shown in FIGS. 1(a) through 1(f) as in the first embodiment.

Next, as shown in FIG. 5(a), the cross-hairs 39a of the television monitor 39 are aligned with the leading end of the lead frame 1A, and the set button is pressed. The cross-hairs 39a are moved by operating an electrical chessman as described in the first embodiment.

Then, as shown in FIG. 5(b), the feeding claws 4 are moved using the manual input means 33 so that the first island 2A of the lead frame 1A is aligned with the island groove 61 of the bonding stage 60 at the bonding position 3b. After it has been visually confirmed by a microscope that the first island 2A is aligned with the island groove 61, the cross-hairs 39a of the television monitor 39 are aligned with the position of the right end of the first island 2A, and the set button is pressed.

Next, as shown in FIG. 5(c), the cross-hairs 39a of the television monitor 39 are aligned with the position of the left end of the first island 2A, and the set button is pressed. As a result, the distance I in which the lead frame 1A has been moved or fed and the distances J and K in which the cross-hairs 39a have been moved are stored in the data memory 36.

The movement distances J and K of the cross-hairs 39a are amounts of movement on the screen of the television monitor 39 and thus have parameters that are different from those of the amount of feeding of the lead frame 1A (in other words, the amount of feeding of the feeding claws 4). Accordingly, these movement distances J and K are converted into the amounts of feeding of the lead frame 1A by the calculation processing section 37 and then stored in the data memory 36.

In the above-operation, the cross-hairs 39a are moved by an electrical chessman so as to obtain the data J and K; however, it is also possible to move the television camera 14 so that the left-end position and right-end position of the first island 2A are aligned with the cross-hairs 39a.

Using the obtained data I, J and K, the calculation processing section 37 calculates the first pitch C using Equation 5.

$$C = I - J + (\tfrac{1}{2}) \cdot K \qquad \text{Equation 5}$$

Next, as shown in FIG. 5(d), the cross-hairs 39a of the television monitor 39 are moved and aligned with an arbitrary position (data point) on the first island 2A, e.g., with one of the corner portions of the first island 2A; and then, the switch is pressed. This position of the cross-hairs 39a acts as a mark for the setting of the next island. The process shown in FIG. 5(d) is the same as the process shown in FIG. 2(b).

Next, as shown in FIG. 5(e), the feeding claws 4 are moved using the manual input means 33 so that the lead frame 1A is moved until the last island 2F is brought to the position of the island groove 61 of the bonding stage 60 at the bonding position 3b.

Then, the feeding claws 4 are moved using the manual input means 33 so that an arbitrary position (data point) on the last island 2F (in this case, one of the corner portions of the last island 2F) is aligned with the cross-hairs 39a of the television monitor 39.

After it has been visually confirmed by a microscope that the last island 2F is aligned with the island groove 61 at the bonding position 3b, the switch is pressed.

As a result, data indicating the distance B by which the lead frame 1A has been moved by the feeding claws 4 from the state shown in FIG. 5(d) to the state shown in FIG. 5(e) is stored in the data memory 36. This process is the same as the process shown in FIG. 2(b). As a result, the calculation processing section 37 calculates the constant pitch distance D using Equation 2 above.

Next, as shown in FIG. 5(f), a feeding operation is performed by the feeding claws 4 until the trailing end of the lead frame 1A is aligned with the cross-hairs 39a of the television monitor 39; then, the set button is pressed so that the feeding distance L in this case is stored in the data memory 36. As a result, the calculation processing section 37 calculates the length A of the lead frame 1 using Equation 6 below. Afterward, the lead frame 1A is conveyed into the unloader side magazine 20B by the unloader side feeding claws (not shown).

$$A = C + B + L - (K/2) \qquad \text{Equation 5}$$

Thus, whenever there is a change in the type of product (lead frame) to be handled, the data required for conveying the changed lead frame 1A can be set by:

a first process in which the cross-hairs 39a of the television monitor 39 are aligned with the leading end of the lead frame 1A, a second process in which the lead frame 1A is fed so that the first island 2A is positioned at the bonding position 3b, and the amount in which the lead frame 1A has been moved or fed in this case is stored in the data memory 36, a third process in which the cross-hairs 39a of the television monitor 39 are aligned with the position of the one end (right end) of the first island 2A, and the amount of movement of the cross-hairs 39a or the amount of movement of the television camera 14 in this case is stored in the data memory 36, a fourth process in which the cross-hairs 39a of the television monitor 39 are aligned with the position of another end (left end) of the first island 2A, and the amount of movement of the cross-hairs 39a or the amount of movement of the television camera 14 in this case is stored in the data memory 36, a fifth process in which the cross-hairs 39a of the television monitor 39 are aligned with an arbitrary position (data point) on the first island 2A, a sixth process in which the lead frame 1A is fed so that an arbitrary position (data point) on the last island 2F is aligned with the cross-hairs 39a of the television monitor 39, and the amount in which the lead frame 1A has been moved or fed in this case is stored in the data memory 36, and a seventh process in which the lead frame 1A is then fed so that the trailing end of the lead frame 1A is aligned with the cross-hairs 39a of the television monitor 39, and the amount in which the lead frame 1A has been moved or fed in this case is stored in the data memory 36.

In this third embodiment, as in the first embodiment, a data setting is accomplished by moving or feeding a lead frame 1A by the feeding claws 4 of the frame feeder, which actually involves a certain amount of error; accordingly, a data setting which involves this error can be accomplished during the setting operation, so that there is no need to check the conveyance or to perform fine adjustments after the completion of data setting.

Figure 9:
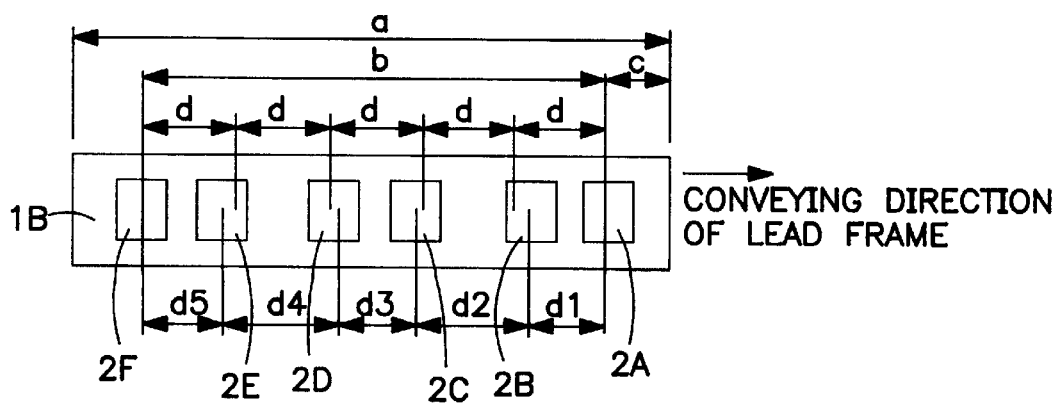

FIGS. 6 and 7 illustrate a fourth embodiment of the present invention. In this embodiment, the lead frame of the type 1B shown in FIG. 9 are to be handled, and the first pitch c is not equal to (½)·d.

Figure 6A:
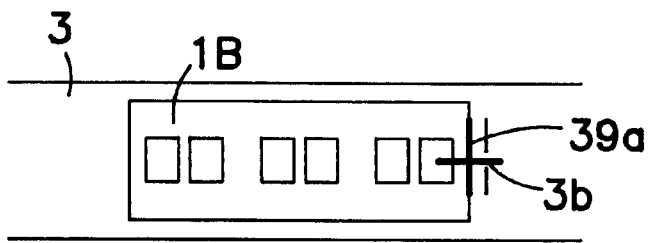
FIGS. 6(a) through 6(e) show a process diagram which illustrates a fourth embodiment of the method of the present invention for setting lead frame conveying data, the process diagram being a continuation of the process diagram shown in FIGS. 1(a) through 1(f)
Figure 6B:
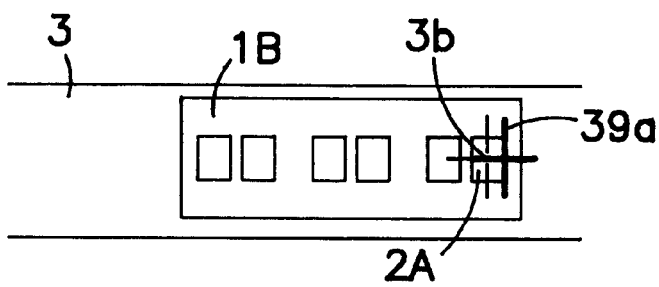
Figure 6C:
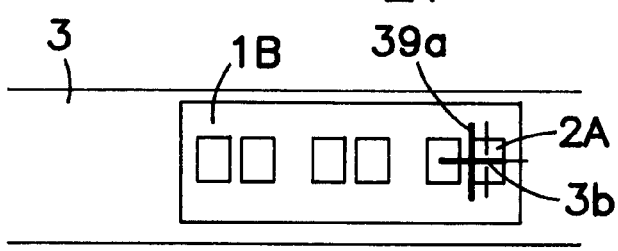
Figure 6D:
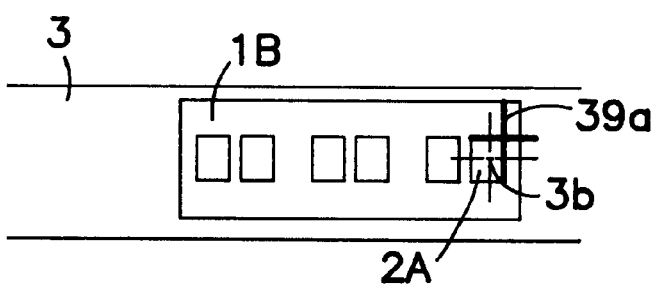
Figure 6E:
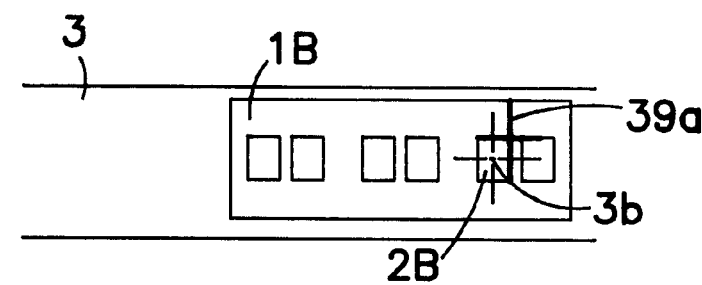
Figure 7A:
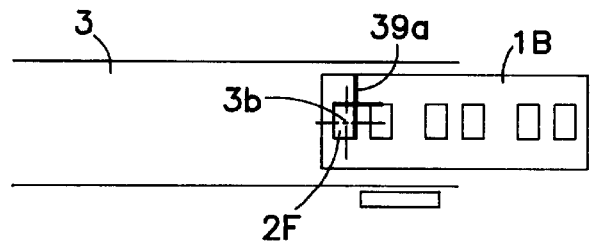
FIGS. 7(a) and 7(b) shows a process diagram which is a continuation of the process diagram shown in FIGS. 6(a) through 6(e)
Figure 7B:
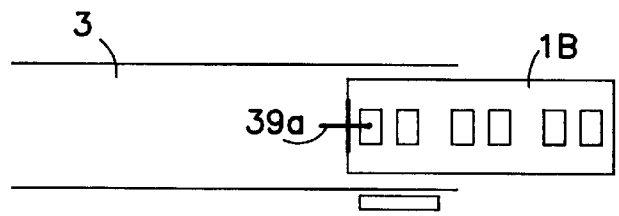

FIGS. 6(a) through 6(c) illustrate a process in which the first pitch c is set in the same manner as in FIGS. 5(a) through 5(c); FIGS. 6(d), 6(e) and 7(a) illustrate a process in which the pitch distances D1, D2, D3, D4 and D5 are set in the same manner as in FIGS. 4(a) through 4(d); and FIG. 7(b) illustrates a process in which the trailing end of the lead frame 1B (i. e., the frame length A) is set in the same manner as in FIG. 5(f). Accordingly, a detailed description of the process from FIG. 6(a) through FIG. 7(b) is omitted, and it is obvious that the data setting is accomplished by the same way as described with reference to FIGS. 5(a) through 5(c), FIGS. 4(a) through 4(d) and FIG. 5(f).

In the respective embodiment described above, the alignment of the islands with the island groove 61 of the bonding stage 60 is confirmed by visual inspection using a microscope. However, this is done merely for confirmation and is not absolutely necessary. Furthermore, in the above embodiments, a description is made in regards to the bonding stage 60 that has an island groove 61; however, the present invention can be of course used for a bonding stage that has no island groove.

Furthermore, the manual input means 33 is used for feeding the lead frame 1A as shown in FIGS. 2(b) and 2(c) in the first embodiment, for feeding the lead frame 1A as shown in FIGS. 4(a) through 4(c) in the second embodiment, for feeding the lead frame 1A as shown in FIGS. 5(a) through 5(f) in the third embodiment, and for feeding the lead frame 1B as shown in FIGS. 6(a) through 6(e) and FIGS. 7(a) and 7(b) in the fourth embodiment. However, it is also possible to program respective processes and set the required data automatically by using a universally known pattern recognition method.

In such a case, the processes for four types of systems comprising respective combinations of lead frame types (either 1A or 1B as shown in FIG. 8 or FIG. 9) and first pitches c (lead frames 1A or 1B in which the first pitch c is either roughly equal to ½ of the constant pitch distance d or not equal to ½ of the constant pitch distance d), i. e., the process shown in FIGS. 2(a) and 2(b) in the case of the first type, the process shown in FIGS. 4(a) through 4(c) in the case of the second type, the process shown in FIGS. 5(a) through 5(f) in the case of the third type and the process shown in FIGS. 6(a) through 6(e) and FIGS. 7(a) and 7(b) in the case of the fourth type, are programmed in the control memory 35 shown in FIG. 11. In addition, the detected portions (data points) of the lead frame 1A or 1B that are imaged by the television camera 14 are subjected to image processing using a pattern recognition method. With these operations, whenever there is a change in the type of product to be handled, one of the first through fourth types described above is elected in advance for the lead frames (1A or 1B) to be handled.

Thus, in the case of FIGS. 2 (2(a)–2(d)), the lead frame 1A is automatically fed, and pattern recognition is performed so that the respective patterns of the islands 2A and 2F are recognized, after which the positions of the islands are automatically set. In the case of FIGS. 4 (4(a)–4(c)), the lead frame 1B is automatically fed, and pattern recognition is performed so that the respective patterns of islands 2A through 2F are recognized, after which the positions of the islands are automatically set. In the case of FIGS. 5 (5(a)–5(f)), the lead frame 1A is automatically fed, and pattern recognition is performed so that the respective patterns of the leading end of the lead frame 1A, one end (right end) position of the first island 2A, another end (left end) position of the first island 2A, an arbitrary position on the first island 2A and an arbitrary position on the last island 2F, are recognized; and then these positions are automatically set. In the case of FIGS. 6 and 7 (6(a)–7(b)), the lead frame 1B is fed and pattern recognition is performed by means of a process combined by the processes shown in FIGS. 4 and 5, so that the positions in question are automatically set. Furthermore, as a result of pattern recognition of the islands 2A through 2F, the number of islands n is automatically stored in the data memory 36.

As shown in FIGS. 2 and 5, the distance B from the first island 2A to the last island 2F is determined in order to calculate the pitch distance D in the case of lead frames 1A in which the islands have a constant pitch. However, it is also possible to determine pitch distances for the respective islands in the same manner as in the case of the lead frames 1B that have irregular-pitch islands as shown in FIGS. 4, 6 and 7.

As seen from the above, according to the present invention, it is possible to set data including positional deviation errors in the feeding pitch which are derived from mechanical working error or assembly error in each individual frame feeder, and it is also possible to accomplish changes in the type of lead frame to be handled in a quick and easy manner.

What is claimed is:

1. A method for setting conveying data for a lead frame that has islands thereon arranged at a constant pitch, said method comprising:

a first step in which
said lead frame is fed so that a first island on said lead frame is positioned at a bonding position,
an arbitrary position on said first island is imaged by a television camera installed above said bonding position, an image of said arbitrary position of said first island is displayed on said television monitor, and then reference marks of a television monitor is aligned with said image of said arbitrary position, and
an amount in which said lead frame has thus been fed is stored in a data memory; and a second step in which
said lead frame is fed so that a last island on said lead frame is positioned at said bonding position,
an arbitrary position of said last island that corresponds to said arbitrary position of said first island is aligned with said reference marks of said television monitor, and
an amount in which said lead frame has thus been fed is stored in said data memory.

2. A method for setting conveying data for lead a frame that has islands thereon, said method comprising:

a first step in which
a lead frame is fed so that a first island on said lead frame is positioned at a bonding position,
an arbitrary position on said first island is imaged by a television camera installed above said bonding position, an image of said arbitrary position of said first island is displayed on said television monitor, and then reference marks of a television monitor are aligned with said image of said arbitrary position
an amount in which said lead frame has thus been fed is stored in a data memory; and a second step in which
said lead frame is fed so that each one of said islands on said lead frame following said first island is positioned at said bonding position,
an arbitrary position of each one of said islands that corresponds to said arbitrary position of said first island is aligned with said reference marks of said television monitor, and
an amount in which said lead frame has thus been fed for each one of said islands is stored in said data memory.

3. A method for setting conveying data for a lead frame that has islands thereon arranged at a constant pitch, said method comprising:

a first step in which
a leading end of said lead frame is fed to a vicinity of a bonding position, and
said leading end of said lead frame is imaged by a television camera installed above said bonding position, said leading end is displayed on a television monitor, and then reference marks of a television monitor are aligned with said image of said leading end of said lead frame;

a second step in which
said lead frame is fed so that a first island on said lead frame is positioned at said bonding position, and
an amount in which said lead frame has thus been fed is stored in a data memory;

a third step in which
said reference marks of said television monitor are moved so as to be aligned with one end of said first island, and
an amount of said movement of said reference marks or an amount of movement of said television camera is stored in said data memory;

a fourth step in which
said reference marks of said television monitor are moved so as to be aligned with another end of said first island, and an amount of said movement of said reference marks or an amount of movement of said television camera is stored in said data memory;

a fifth step in which
said reference marks of said television monitor are moved so as to be aligned with an arbitrary position of said first island;

a sixth step in which
said lead frame is fed so that a last island on said lead frame is positioned at said bonding position,
an arbitrary position of said last island that corresponds to said arbitrary position of said first island is aligned with said reference marks of said television monitor, and
an amount in which said lead frame has thus been fed is stored in said data memory; and a seventh step in which
said lead frame is fed so that a trailing end of said lead frame is aligned with said reference marks of said television monitor, and
an amount in which said lead frame has thus been fed is stored in said data memory.

4. A method for setting conveying data for a lead frame, said method comprising:

a first step in which
a leading end of said lead frame is fed to a vicinity of a bonding position, and
said leading end of said lead frame is imaged by a television camera installed above said bonding position, said lead end is displayed on a television monitor, and reference marks of a television monitor are aligned with said image of said leading end of said lead frame;

a second step in which
said lead frame is fed so that a first island on said lead frame is positioned at said bonding position, and
an amount in which said lead frame has thus been fed is stored in a data memory;

a third step in which
said reference marks of said television monitor are moved so as to be aligned with one end of said first island, and
an amount of said movement of said reference marks or an amount of movement of said television camera is stored in said data memory;

a fourth step in which
said reference marks of said television monitor are moved so as to be aligned with another end of said first island, and
an amount of said movement of said reference marks or an amount of movement of said television camera is stored in said data memory;

a fifth step in which
said reference marks of said television monitor are moved so as to be aligned with an arbitrary position of said first island;

a sixth step in which
said lead frame is fed so that each one of said islands on said lead frame following said last island is positioned at said bonding position,
an arbitrary position of each one of said islands that corresponds to said arbitrary position of said first island is aligned with said reference marks of said television monitor, and
an amount in which said lead frame has thus been fed for each one of said islands is stored in said data memory; and a seventh step in which
said lead frame is fed so that a trailing end of said lead frame is aligned with said reference marks of said television monitor, and
an amount in which said lead frame has thus been fed is stored in said data memory.

* * * * *